United States Patent [19]

Heytmeijer

[11] 4,234,304
[45] Nov. 18, 1980

[54] CIRCUIT BOARD HAVING CONDUCTOR RUNS RESISTANT TO FORMATION OF NON-CONDUCTIVE LOCALIZED AREAS AND METHOD

[75] Inventor: Herman R. Heytmeijer, Hanover Township, Morris County, N.J.

[73] Assignee: Westinghouse Electric Corp., Pittsburgh, Pa.

[21] Appl. No.: 923,596

[22] Filed: Jul. 11, 1978

[51] Int. Cl.³ .................. F21K 5/02; G03B 15/02; H01B 1/20

[52] U.S. Cl. .................................. 431/359; 174/68.5; 252/514; 252/518; 362/11; 362/13; 362/14; 362/15; 427/96; 427/217

[58] Field of Search ............... 174/68.5; 431/359; 427/96, 217; 252/514, 518; 362/11, 13, 14, 15

[56] References Cited

U.S. PATENT DOCUMENTS

| | | | |
|---|---|---|---|
| 3,988,647 | 10/1976 | Bolon et al. | 174/68.5 |
| 3,990,832 | 11/1976 | Smialek | 431/95 A |
| 4,049,844 | 9/1977 | Bolon et al. | 427/217 |
| 4,133,023 | 1/1979 | Hanson | 431/359 |
| 4,133,630 | 1/1979 | Yreeswijk et al. | 431/359 |
| 4,133,631 | 1/1979 | Collins et al. | 431/359 |
| 4,158,879 | 6/1979 | Peterson | 431/359 |

*Primary Examiner*—John D. Smith
*Attorney, Agent, or Firm*—R. S. Lombard

[57] ABSTRACT

An improved circuit board comprising a substrate having electrical conductor runs resistant to the formation of electrically non-conductive localized areas carried thereon. Such a circuit board is particularly adapted to use with a flash lamp array having a plurality of flash lamps and sequencing electrical circuitry for sequentially flashing the lamps. The sequencing electrical circuitry is formed in part by the conductor runs. The conductor runs comprise an organic polymer binder for attachment of the conductor runs to the substrate and silver-coated vitreous bead-like particles with a triazole-silver water-insoluble reaction product comprising the surface of the bead-like particles. The triazole-silver reaction product prevents the formation of non-conductive localized areas in the conductor runs.

17 Claims, 2 Drawing Figures

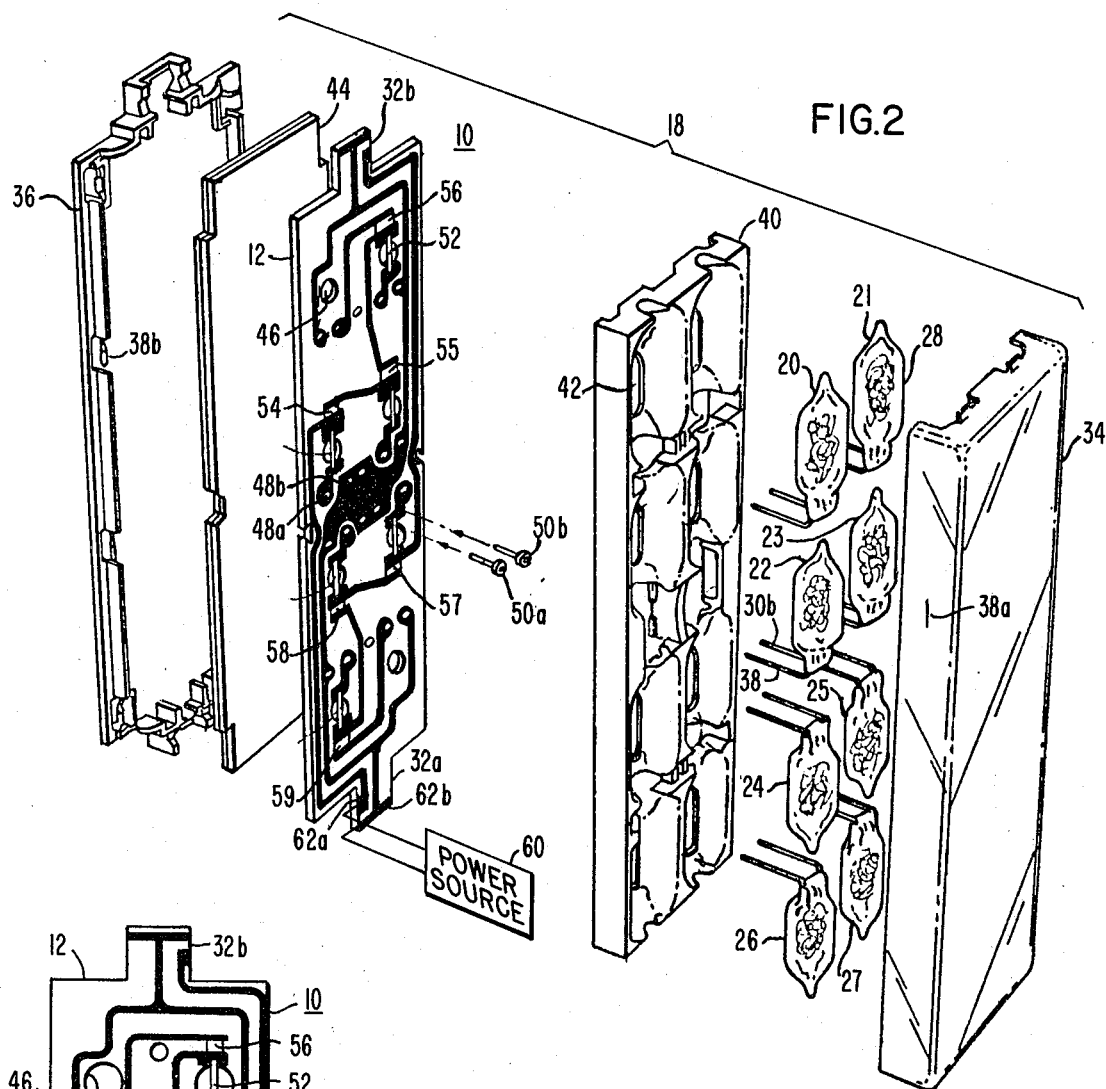
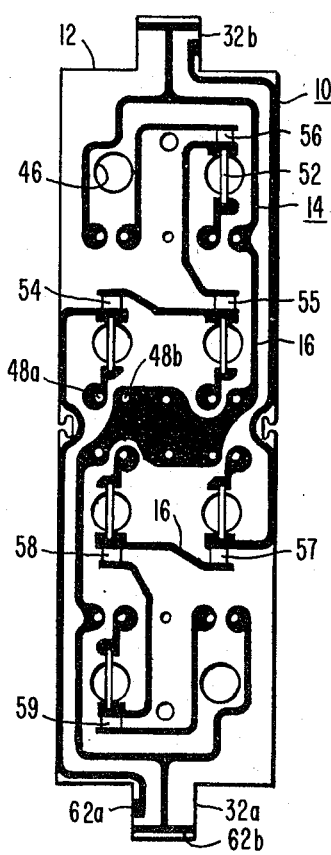

CIRCUIT BOARD HAVING CONDUCTOR RUNS RESISTANT TO FORMATION OF NON-CONDUCTIVE LOCALIZED AREAS AND METHOD

CROSS-REFERENCE TO RELATED APPLICATIONS

In copending application Ser. No. 923,595, filed concurrently herewith by H. R. Heytmeijer et al. and owned by the same assignee, is disclosed a method for making a circuit board having conductor runs utilizing a vaporizable solvent conductive ink and small silver-coated vitreous bead-like particles.

In copending application Ser. No. 913,777 filed June 8, 1978, by the present applicant and owned by the same assignee, is disclosed solid-state switches for a flash lamp array comprising a uniform mixture of finely divided silver carbonate, silver oxide and hydrophobic silica.

BACKGROUND OF THE INVENTION

This invention relates to circuit boards and, more particularly, to a circuit board adapted for use with a flash lamp array having a plurality of flash lamps. One such circuit board described in U.S. Pat. No. 3,990,832 dated Nov. 9, 1976, issued to Smialek et al., discloses a flash lamp array having a plurality of lamps fired individually and in sequence including a circuit board carrying thereon a plurality of static solid switching devices capable of being easily activated by radiant energy generated during the flashing of the lamps. Initially, the switches have a high resistance and after being activated by radiation, they undergo chemical conversion to a conductive state. In order to prevent the switches from converting to a conductive state before the flashing of the lamps, a small amount by weight of a weak acidic organic compound, such as an aromatic triazole compound, is included which reacts with silver ions to form a water insoluble reaction product which inhibits water from substantially reducing the high electrical resistance of the silver compound and thereby prevents the switches from becoming conductive before the lamps are flashed.

A method for making a circuit board for a photo flash array is described in U.S. Pat. No. 3,988,647 dated Oct. 26, 1976, issued to Bolon et al. The Bolon patent discloses a circuit board suitable for activating high voltage flash lamps comprising a non-conductive substrate having patterned electrically conductive circuitry comprised of an organic resin matrix and a particulated electrically conductive metal containing material. The organic resin matrix is typically a reaction product of styrene and polyester and the electrically conductive metal containing material is silver-coated glass beads. The conductive circuitry as disclosed is made in part of an ultraviolet radiation curable ink screened to the polystyrene substrate.

A method for making a circuit board is described in U.S. Pat. No. 4,049,844 dated Sept. 20, 1977, issued to Bolon et al. This patent discloses a method for making a circuit board involving the screen printing of a radiation curable ink onto the surface of a substrate followed by the radiation cure of the ink.

SUMMARY OF THE INVENTION

The present invention is provided in combination with a circuit board including a non-conductive substrate having electrical circuitry affixed thereto. The improvement comprises electrical conductor runs forming a part of the circuitry affixed to the substrate. The conductor runs are resistant to the formation of electrically non-conductive localized areas therein. The conductor runs typically comprise an organic polymer binder for affixation of the conductor runs to the substrate and small vitreous bead-like particles with a thin silver coating carried thereon with the surface of the particles comprising triazole-silver water-insoluble reaction product. The bead-like particles are adhered to the substrate by a matrix of organic polymer binder. The relative proportion of the bead-like particles to the polymer binder are such that adjacently positioned bead-like particles are in electrically conductive relationship with one another to provide a resistivity of less than about 0.03 ohm-cm for the runs. The triazole-silver water-insoluble reaction product inhibits the formation of non-conductive localized areas in the conductor runs. Such a circuit board is particularly adapted for use with a flash lamp array having a plurality of flash lamps and sequencing electrical circuitry for sequentially flashing the lamps. A method for making the improved circuit board is also provided.

BRIEF DESCRIPTION OF THE DRAWINGS

For a better understanding of the invention, reference may be had to the preferred embodiment, exemplary of the invention, shown in the accompanying drawings, in which:

FIG. 1 is a plan view of a circuit board showing the electrical circuitry carried thereon; and FIG. 2 is an exploded isometric view of a typical flash lamp array showing the position of the circuit board in relation to the other components.

DESCRIPTION OF THE PREFERRED EMBODIMENT

In FIG. 1 there is shown a circuit board 10 comprising a non-conductive substrate 12 typically made of a plastic such as polystyrene, and electrical circuitry 14 carried on and affixed to the substrate 12. The improvement includes electrical conductor runs 16 which are shown darkened in FIG. 1. The conductor runs 16 form a part of the electrical circuitry 14 carried on the substrate 12. The conductor runs 16 are resistant to the formation of electrically non-conductive localized areas therein and they comprise smal vitreous bead-like particles having a thin silver coating carried thereon with the surface of the particles comprising triazole-silver water-insoluble reaction product. A matrix of organic polymer binder adheres the bead-like particles to the substrate. The relative proportion of the bead-like particles to the polymer binder is such that adjacently positioned bead-like particles are in electrically conductive relationship with one another to provide a resistivity of less than about 0.03 ohm-cm for the runs. The triazole-silver reaction product prevents the formation of the non-conductive localized areas in the conductor runs 16.

The conductor runs 16 preferably comprise the silver-coated vitreous bead-like particles in amount from about 86 to 94 wt. %, and organic polymer binder in amount from about 6 to 14 wt. %.

Although the present invention may have use in many different electronic devices, it is particularly adapted to use with a flash lamp array 18 as shown in FIG. 2. The array 18 includes a plurality of electrically fired flash lamps 20–27, each having a tubular-shaped vitreous envelope 28 heremetically sealed to a pair of lead-end wires 30a, 30b. The lamp array 18 is typically provided with a plug-in connector tab 32a at the lower side or end thereof, adapted to be mountable in a socket of a camera or flash adapter. The lamp array 18 is also provided with a second plug-in connector tab 32b at the upper side or end thereof, whereby the array 18 can be mounted in a camera socket by either tab 32a or 32b to fire all of the lamps, as is conventional in such a design.

The array 18 comprises an upper group of flash lamps 20, 21, 22, 23, and a lower group of flash lamps 24, 25, 26, 27, the lamps being arranged in a planar configuration. When the lamps are mounted in a camera socket by the tab 32a, only the upper group of the lamps will be flashed; likewise, when the array is mounted in a camera socket by tab 32b only the lower group (now in the uppermost position) will be flashed. With this arrangement having only the lamps relatively far from the lamp's axis being flashable, the undesirable "red-eye" effect will be reduced, as is well known in the art.

The array 18 also conventionally includes front cover member 34 for covering the flash lamps and which is normally made of a color corrected light-transmitting plastic and a rear cover member 36 normally made of clear plastic. The front cover member 34 and the rear cover member 36 typically have interlocking means 38a, 38b for locking the front cover member 34 to the rear cover member 36. Between the front cover member 34 and the rear cover member 36, in the following order, are: the flash lamps 20–27; a reflector member 40 for reflecting light from the flash lamps toward the front cover member 34 and having windows 42 passing therethrough; circuit board 10 including the non-conductive substrate 12 having electrical circuitry 14 which is shown is for sequentially flashing the lamps. The circuit board 12 includes the integral connector tabs 32a, 32b. Flash sensing indicator 44 indicates to the operator of the array when a lamp has been flashed. The circuit board 10 is positioned within the array 18 with the electrical circuitry 14 on one side thereof nearest the reflector member 40. The sequencing circuitry 14 has the lead-in wires 30, 30a connected in circuit therewith for automatically flashing the lamps in each group in a predetermined sequence. The lamps 20–27 are positioned in close proximity to the one side of the circuit board 10. The substrate 12 is provided with openings 46 passing therethrough, each in alignment with one of the flash lamps 20–27 and the windows 42 to permit the passage of radiant energy upon the flashing of each of the aligned lamps. The lead-in wires 30a, 30b may be electrically connected to the sequencing circuitry 14 by any suitable means, such as providing substrate 12 with apertures 48a, 48b into which metallic eyelets 50a, 50b are inserted. The lead-in wires 30a, 30b are of sufficient length to extend through the eyelets 50a, 50b. The eyelets are then crimped thereby electrically connecting the lead-in wires 30a, 30b to the sequencing circuitry 14.

Preferably included on the substrate 12 as part of the sequencing circuitry 14 are fuses 52 covering a part of some of the openings 46 as shown in FIG. 1. The fuses 52 are made of a thin conductive metallic strip typically consisting of pressure sensitive adhesive-backed aluminized "Mylar" plastic, a trademark of the DuPont Company for polyethylene terephthalate, which upon the flashing of a lamp, the corresponding fuse 52 will be impinged by heat radiation of the flashed lamp, burn through and thereby act as a safety to ensure that the lamp is completely out of the circuitry 14. Also included on the substrate 12 as part of the sequencing circuitry 14 are heat radiation sensitive solid-state switches 54–59, each being initially in an open or non-conductive electrical state and upon the flashing of an aligned lamp converting to a closed or conductive electrical state. The switches typically comprise a mixture of silver carbonate and silver oxide in an organic binder. Electrically connecting the aforesaid fuses 52, switches 54–59, lamps 20–27, and an energy source 60 which may be a piezoelectric voltage source, for example, are the positively performing conductor runs 16. The array 18 as described to this point is generally conventional.

The improved conductor runs 16 can be made from a circuit ink composed of small silver-coated vitreous bead-like particles having, for example, a nominal 19 micron size and coated with 8% silver by weight; an organic polymer such as polyvinyl butyral resin which gives good adhesion to the metallized surface of the fuses 52 and to the substrate 12; and a readily vaporizable organic solvent such as ethylene glycol monobutyl ether acetate together with benzyl alcohol. This circuit ink has the following desirable properties: it is easily applied to the substrate 12 by silk screening; the conductor runs 16 made from the ink are sharp and have little ink run-out; the ink does not flake off the ends of the fuses 52; the ink adheres well to the substrate 12; the runs have good conductivity; the runs are easily made and do not require expensive ultraviolet radiation equipment; and, the runs have a relatively low silver content.

In testing this circuit ink, a small but significant percentage of the circuit boards made with same developed electrically non-conductive or high resistance localized areas or discontinuities when exposed to high temperature, high humidity conditions (one week exposure at 50° C. and 95% relative humidity). It was found, though, that when the circuit boards 10 were washed with a detergent prior to the application of the circuit ink, the formation of the electrically non-conductive localized areas was inhibited. It is postulated therefore that these electrically non-conductive localized areas are associated with a surface contamination of the substrate 12 which possibly comprised mineral or silicon oil picked up prior to the application of circuit ink. It is likely that such material would dissolve in the solvent constituent of the freshly laid down circuit ink or it might cause solvent-resin incompatibility during solvent vaporization resulting in resin-rich and silver bead-like particle-rich areas. Photomicrographs of the electrically non-conductive localized area show that these areas have a high concentration of resin. These areas of high resin-to-bead ratio are vulnerable to the detrimental effect of temperature and humidity. For example, when a circuit ink in which the resin-to-bead ratio is doubled from one:ten to two:ten, the incidents of the electrically non-conductive localized areas increased from about 5% to about 60%.

These electrically non-conductive localized areas are usually associated with a slight darkening of that particular section of a conductor run and can thus be predicted by visual inspection of the exposed circuit boards 10; the mechanism of the phenomenon though is not clearly understood. Another possible explanation is that a separation of the silver-coated bead-like particles and/or a destruction of their silver coating takes place once predisposing conditions occur. It was also found that the composition of the substrate 12 may cause the electrically non-conductive localized areas. In testing a group of substrates, resistance of the conductor runs was suddenly doubled from that of previous substrates. It was found that a slightly different polystyrene had been used for molding the substrates. Therefore, apparently in addition to localized extraneous contamination of the substrates, the electrically non-conductive areas might also result from local inconsistencies in the substrates.

The present invention provides a solution to the problem by making the conductor runs 16 insensitive to the conditions that normally cause the electrically non-conductive localized areas.

The method for making a circuit board 10 having electrical conductor runs carried on and adhered to a non-conductive substrate and which conductor runs are resistant to the formation of electrically non-conductive localized areas therein, entails the following steps:

(a) immersing small silver-coated vitreous bead-like particles in an aqueous benzotriazole solution to form a triazole-silver reaction product on the surface of the beads;

(b) separating the silver-coated bead-like particles from the solution;

(c) drying the silver-coated bead-like particles to remove residual water;

(d) mixing the silver-coated bead-like particles together with an organic polymer binder and a readily vaporizable organic solvent to form circuit ink;

(e) applying the circuit ink to a predetermined area of the substrate by silk screening; and (f) drying the circuit ink to vaporize the solvent to form the conductor runs.

It has also been found desirable to include hydrophobic silica in the mixture with the silver-coated beads, the organic polymer binder, and the organic solvent to form circuit ink. The hydrophobic silica prevents a galvanic action from occurring under high humidity conditions between the metal of the fuses 52 (typically aluminum coated "Mylar") and the silver-coated vitreous bead-like particles. The hydrophobic silica also acts as an antisettling agent and at low percentages it prevents hard settling of the silver-coated vitreous bead-like particles, at high percentages it completely prevents settling permitting easier application of the circuit ink to the circuit board 10.

Preferably the circuit ink should be composed of the following: silver-coated glass bead-like particles from about 56 to 79 wt. % of the circuit ink having an average particle size of 19 microns; the organic polymer binder should be from about 5 to 9 wt. % of the circuit ink; and the organic solvent should be from about 16 to 35 wt. % of the circuit ink; and the hydrophobic silica should be from about 0.25 to 0.4 wt. % of the circuit ink. The hydrophobic silica preferable has a nominal particle size of 0.007 micron and an average surface area of 225 $m^2$/gm.

EXAMPLE a. Silver-Coated Vitreous Bead-Like Particles Reacted with Benzotriazole Benzotriazole such as that manufactured by Sherwin-Williams under the trade designation "Cobratec 99" has been found especially effective in preventing the formation of electrically non-conductive localized areas. Two hundred grams of the silver-coated vitreous bead-like particles are immersed in a 2% aqueous solution of "Cobratec 99" for about 10 minutes at about 70° C. The silver-coated bead-like particles are separated from the solution by filtering and are washed with water and dried overnight at 70° C.

b. Preparation of the Resin Solution

The following are mixed together in a high shear mixer until dissolved: 190 ml of ethylene glycol monobutyl ether acetate; 67 ml of benzyl alcohol; 3.3 grams of hydrophobic silica, such as that manufactured by Tulco, Inc. under trade designation "Tullanox 500D"; and 67 grams of "Mowital B30HH" which is polyvinyl butyral resin manufactured by the American Hoechst Corporation.

c. Preparation of the Ink

Using a propeller stirrer, 327 grams of the above resin solution and 673 grams of triazole-treated silver-coated vitreous bead-like particles which are initially manufactured by Potter Industries, Inc., designated as "S-3000-S2", are mixed together.

d. Screening the Circuit Ink

The circuit ink is applied to a predetermined area of the circuit board by silk screening for example, and is then dried by passing air having a temperature of about 70° C. over the substrate for about 10 minutes to vaporize. This produces conductor runs that are about 0.051 mm thick, generally 1.02 mm wide in a pattern as shown in FIG. 2 having a resistivity of about 0.0022 ohm-cm.

In addition rather than separately treating the silver-coated vitreous bead-like particles with "Cobratec 99", a direct addition of it to the resin solution in amounts from 0.1 wt. % to 2 wt. % of the solution based on the bead-like particles has been found effective and although no electrically non-conductive localized areas have been found to occur during humidity chamber testing, the resistivity of the conductor runs increased by a factor of three.

By practicing this invention, the silver-coated vitreous bead-like particles in the conductor runs have a triazole-silver water-insoluble reaction product adhered to the surface of the bead-like particles. This prevents formation of the non-conductive localized areas in the conductor runs. The final composition of the conductor runs preferably comprises silver-coated glass bead-like particles in the amount from about 86 to 94 wt. %; the organic polymer binder in an amount from about 6 to 14 wt. %; and the hydrophobic silica from about 0.35 to 0.50 wt. %.

With the array 18 mounted in the camera socket using tab 32a, the array functions as follows: when the operator of the camera actuates the shutter, a voltage is applied across circuit branches 62a, 62b, the voltage because of the design of the circuitry 14 is first applied to flash lamp 22 through lead-in conductors 30a, 30b. Upon the activation of the shutter, flash lamp 22 is flashed, switch 54 is caused to become conductive, and flash sensing indicator 44 indicates to the operator that the lamp 22 has been flashed, and the aligned fuse 52 burns through. Upon the next actuation of the shutter by the operator, the lamp 23 is caused to fire because of switch 54 becoming conductive and the process is repeated as hereinbefore explained until lamp 20 is fired at which time the array is turned end-over-end with tab 32b being mounted in the camera socket and the lamps 24-27 are ready to be flashed in the same sequential manner.

I claim:

1. In combination with a circuit board comprising a non-conductive substrate having electrical circuitry affixed thereto, the improvement which comprises:

electrical conductor runs forming a part of said electrical circuitry adhered to and carried on said substrate, said conductor runs comprising small vitreous bead-like particles having a thin silver coating carried thereon with the surface of said silver-coated bead-like particles comprising a triazole-silver water-insoluble reaction product, said bead-like particles adhered to said substrate by a matrix of organic polymer binder, and the relative proportion of said bead-like particles to said polymer binder being such that adjacently positioned bead-like particles are in electrically conductive relationship with one another to provide a resistivity of less than about 0.03 ohm-cm for said runs, whereby said triazole reacted surface of said bead-like particles substantially inhibits the formation of non-conductive localized areas in said conductor runs.

2. The circuit board of claim 1, wherein said conductor runs comprise said triazole reacted silver-coated vitreous bead-like particles in amount from about 86 to 94 wt. %, and said organic polymer binder in amount from about 6 to 14 wt. %.

3. The circuit board of claim 1, wherein said relative proportion of said bead-like particles to said polymer binder provides a resistivity of about 0.0022 ohm-cm.

4. In combination with a flash lamp array including a plurality of flash lamps and a circuit board comprising a non-conductive substrate having sequencing electrical circuitry affixed thereto for sequentially flashing said lamps, the improvement which comprises:

electrical conductor runs forming a part of said sequencing circuitry adhered to and carried on said substrate, said conductor runs comprising small vitreous bead-like particles having a thin silver coating carried thereon with the surface of said thin silver-coated bead-like particles comprising a triazole-silver water-insoluble reaction product, said bead-like particles adhered to said substrate by a matrix of organic polymer binder, and the relative volume proportion of said bead-like particles to said polymer binder being such that adjacently positioned bead-like particles are in electrically conductive relationship with one another to provide a resistivity of less than about 0.03 ohm-cm for said runs, whereby said triazole reacted surface of said bead-like particles substantially inhibits the formation of non-conductive localized areas in said conductor runs.

5. The array of claim 4, wherein said conductor runs comprise said triazole reacted silver-coated vitreous bead-like particles in an amount from about 86 to 94 wt. %, said organic polymer binder in an amount from about 6 to 14 wt. %.

6. A method of making a circuit board having electrical conductor runs carried on and adhered to a non-conductive substrate thereof, said conductor runs resistant to the formation of electrically non-conductive localized area therein, said method comprising:

(a) immersing small silver-coated vitreous bead-like particles in an aqueous benzotriazole solution to treat said bead-like particles by forming a triazole-silver reaction product on the surface of said bead-like particles;

(b) separating said silver-coated bead-like particles from said solution;

(c) drying said silver-coated bead-like particles to remove residual water;

(d) mixing said silver-coated bead-like particles together with an organic polymer binder and a readily vaporizable organic solvent to form circuit ink;

(e) applying said circuit ink to a predetermined area of said circuit board by silk screening; and (f) drying said circuit ink by vaporizing said solvent to form said conductor runs.

7. The method of claim 6, wherein hydrophobic silica is mixed together with said silver-coated bead-like particles, said organic polymer binder and said organic solvent to form said circuit link.

8. The method of claim 7, wherein said aqueous benzotriazole solution has a 2% concentration of benzotriazole.

9. The method of claim 6, wherein said silver-coated vitreous bead-like members have a nominal particle size of about 19 microns.

10. The method of claim 6, wherein said silver-coated vitreous bead-like members contain about 8% by weight silver.

11. The method of claim 6, wherein said organic polymer binder comprises polyvinyl butyral resin.

12. The method of claim 6, wherein said organic solvent comprises ethylene glycol monobutyl ether acetate and benzyl alcohol.

13. The method of claim 6, wherein said silver-coated vitreous bead-like particles comprise from about 56 to 79 wt. % of said circuit ink; said organic polymer binder comprises from about 5 to 9 wt. % of said circuit ink; and said organic solvent comprises from about 16 to 35 wt. % of said circuit ink.

14. The method of claim 7, wherein said hydrophobic silica comprises from about 0.25 to 0.4 wt. % of said circuit ink.

15. The method of claim 7, wherein said hydrophobic silica has a nominal particle size of about 0.007 and an average surface area of 225 m²/gm.

16. The method of claim 6, wherein said circuit ink is dried at about 70° C. for about 10 minutes.

17. A method of making a circuit board having electrical conductor runs carried on and adhered to a non-conductive substrate thereof, said conductor runs resistant to the formation of electrically non-conductive localized areas therein, said method comprising:

(a) mixing small silver-coated vitreous bead-like particles together with benzotriazole, an organic polymer binder, and a readily vaporizable organic solvent to form circuit ink;

(b) applying said circuit ink to a predetermined area of said circuit board by silk screening; and (c) drying said circuit ink by vaporizing said solvent to form said conductor runs.

* * * * *